United States Patent
Sandhu

(10) Patent No.: US 8,630,145 B2
(45) Date of Patent: *Jan. 14, 2014

(54) INTEGRATED CIRCUITRY AND SWITCHES

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/886,181

(22) Filed: May 2, 2013

(65) Prior Publication Data

US 2013/0240827 A1  Sep. 19, 2013

Related U.S. Application Data

(63) Continuation-in-part of application No. 13/050,630, filed on Mar. 17, 2011, now Pat. No. 8,456,947, which is a continuation-in-part of application No. 13/043,245, filed on Mar. 8, 2011, now abandoned.

(51) Int. Cl.
*G11C 5/12* (2006.01)
*H01H 36/00* (2006.01)

(52) U.S. Cl.
USPC .......................................................... 365/242

(58) Field of Classification Search
USPC .................. 365/189.17, 189.2, 242; 200/181; 257/9, 29; 327/539
See application file for complete search history.

(56) References Cited

U.S. PATENT DOCUMENTS

| | | | |
|---|---|---|---|
| 8,456,947 B2 * | 6/2013 | Sandhu ......................... | 365/242 |
| 2007/0165442 A1 | 7/2007 | Hosoi et al. | |
| 2009/0020764 A1 | 1/2009 | Anderson et al. | |
| 2010/0176366 A1 | 7/2010 | Fu et al. | |
| 2010/0187588 A1 | 7/2010 | Kim et al. | |
| 2010/0213435 A1 | 8/2010 | Fujii et al. | |
| 2010/0214012 A1 | 8/2010 | Raza | |
| 2011/0006837 A1 | 1/2011 | Wang et al. | |
| 2011/0101308 A1 | 5/2011 | Avouris et al. | |
| 2011/0101309 A1 | 5/2011 | Lin et al. | |
| 2011/0108806 A1 * | 5/2011 | Davidovic et al. ............... | 257/29 |
| 2011/0240946 A1 * | 10/2011 | Miao et al. ......................... | 257/3 |
| 2011/0253969 A1 | 10/2011 | Dai et al. | |
| 2012/0115295 A1 | 5/2012 | Lin et al. | |
| 2012/0153119 A1 * | 6/2012 | Patil et al. ...................... | 250/200 |

OTHER PUBLICATIONS

"Bilayer Graphene Gets a Bandgap", Berkeley Lab, Lawrence Berkeley National Laboratory Jun. 10, 2009, retrieved online from http://newscenter.lbl.gov/news-releases/2009/06/10/graphene-bandgap/ on Feb. 14, 2011.

(Continued)

*Primary Examiner* — Huan Hoang
*Assistant Examiner* — Jay Radke
(74) *Attorney, Agent, or Firm* — Wells St. John P.S.

(57) ABSTRACT

Some embodiments include switches that have a graphene structure connected to a pair of spaced-apart electrodes. The switches may further include first and second electrically conductive structures on opposing sides of the graphene structure from one another. The first structure may extend from one of the electrodes, and the second structure may extend from the other of the electrodes. Some embodiments include the above-described switches utilized as select devices in memory devices. Some embodiments include methods of selecting memory cells.

6 Claims, 8 Drawing Sheets

(56) References Cited

OTHER PUBLICATIONS

Echtermeyer et al., "Nonvolatile Switching in Graphene Field-Effect Devices", IEEE Electron Device Letters, vol. 29(8), Aug. 2008.

Kim et al., "Realization of a High Mobility Dual-gated Graphene Filed Effect Transistor with Al2O Dielectric", Applied Physics Leters, vol. 94, 062107 (2009). Retrieved online from http://arxiv.org/abs/0901.2901 on Feb. 14, 2011.

Li et al., "Chemically Deprived, Ultrasmooth Graphene Nanoribbon Semiconductors", Science Magazine, vol. 319, Feb. 29, 2008, pp. 1229-1232.

Novoselov et al., "Two-dimensional atomic crystals," Jul. 26, 2005, The National Academy of Sciences of the USA, vol. 102, pp. 10451-10453.

Sui et al., "Screening and Interlayer Coupling in Multilayer Graphene Field-Effect Transistors", Nano Letters 2009, vol. 9(8), pp. 2973-2977. American Chemical Society. Published on Web Jul. 29, 2009.

Tang et al., "A tunable phonon-exciton Fano system in bilayer graphene", Nature Nanotechnology Letters, vol. 5, Jan. 2010. Published online Nov. 15, 2009.

Zhang et al., "Direct observation of a widely tunable bandgap in bilayer graphene", Nature Letters, vol. 45, Jun. 2009.

\* cited by examiner

INTEGRATED CIRCUITRY AND SWITCHES

RELATED PATENT DATA

This patent resulted from a continuation of U.S. patent application Ser. No. 13/050,630, which was filed Mar. 17, 2011, which issued as U.S. Pat. No. 8,456,947, and which is hereby incorporated herein by reference; which is a continuation-in-part of U.S. patent application Ser. No. 13/043,245, which was filed on Mar. 8, 2011.

TECHNICAL FIELD

Integrated Circuitry, switches, and methods of selecting memory cells of a memory device.

BACKGROUND

A switch is a component utilized to reversibly open and close a circuit. A switch may be considered to have two operational states, with one of the states being an "on" state and the other being an "off" state. Current flow through the switch will be higher in the "on" state that in the "off" state, and some switches may permit essentially no current flow in the "off" state. Switches may be utilized anywhere in an integrated circuit where it is desired to reversibly open and close a portion of the circuit.

A type of circuitry that may be present in an integrated circuit is memory. The memory is used in computer systems for storing data. The memory cells are configured to retain or store information in at least two different selectable states. In a binary system, the states are considered as either a "0" or a "1". In other systems, at least some individual memory cells may be configured to store more than two levels or states of information. The different memory states of a memory cell may correspond to different electrical properties within the cell, and may, for example, correspond to different resistances through the cell. For instance, one of the memory states of a binary system may be a high-resistance state of the memory cell, and the other of the memory states of the system may be a low-resistance state of the cell. Accordingly, reading of the cell may comprise determining current flow through the cell under a pre-defined voltage.

One type of memory cell is a so-called cross-point memory cell, which comprises programmable material between two electrically conductive electrodes. Numerous programmable materials are known which can be suitable for utilization in cross-point memory. For instance, phase change materials (such as, for example, various chalcogenides) may be utilized as programmable materials. Memory that utilizes phase change material as the programmable material is sometimes referred to as phase change random access memory (PCRAM). As another example, some programmable materials may utilize ions as mobile charge carriers to transition from one memory state to another. Such programmable materials may be incorporated into Resistive Random Access Memory (RRAM).

A difficulty in utilizing cross-point memory is that there can be substantial leakage of current through the cross-point memory cells, and such may adversely lead to errors during retrieval of stored data from a memory device. Accordingly, diodes or other select devices are commonly paired with the memory cells to assist in control of current through the memory cells. A switch can be a suitable select device.

It would be desirable to develop improved switches suitable for utilization in integrated circuitry, and it would be further desirable to develop switches suitable for utilization as select devices in memory devices (such as memory arrays).

DETAILED DESCRIPTION OF THE ILLUSTRATED EMBODIMENTS

Some embodiments utilize graphene (for instance, bilayer graphene) as a current-conducting wire through a switch, and utilize an electric field transverse to the current-conducting wire to change a bandgap within the graphene. Increasing the bandgap turns the switch "off", and decreasing the bandgap turns the switch "on". Such switches may have very high current flow when the transverse electric field is low (or absent), since the graphene may, in some embodiments, have no effective bandgap in the absence of a sufficient transverse electric field to impart the bandgap. A relationship between a transverse electric field and the bandgap of bilayer graphene is described in several articles by Feng Wang (for instance, Zhang, et. al., Nature 459, 820-823 (11 Jun. 2009)).

Another way of imparting a bandgap to graphene is to than the graphene be a strip having a narrow dimension (for instance, a dimension of less than or equal to about 20 nanometers, less than about 10 nanometers, or even less than or equal to about 5 nanometers). A relationship between graphene strip dimensions and bandgap is described in several articles by H. Dai (for instance, Li et. al., Science 319, 1229-1232 (2008)). In some embodiments, the bilayer graphene within a switch may be formed to have each individual layer be a strip configured to have an inherent bandgap (i.e., a bandgap which is present even in the absence of any transverse electric field), which may provide additional control over current flow through the switch than can be achieved with graphene structures lacking an inherent bandgap.

Figure 1:
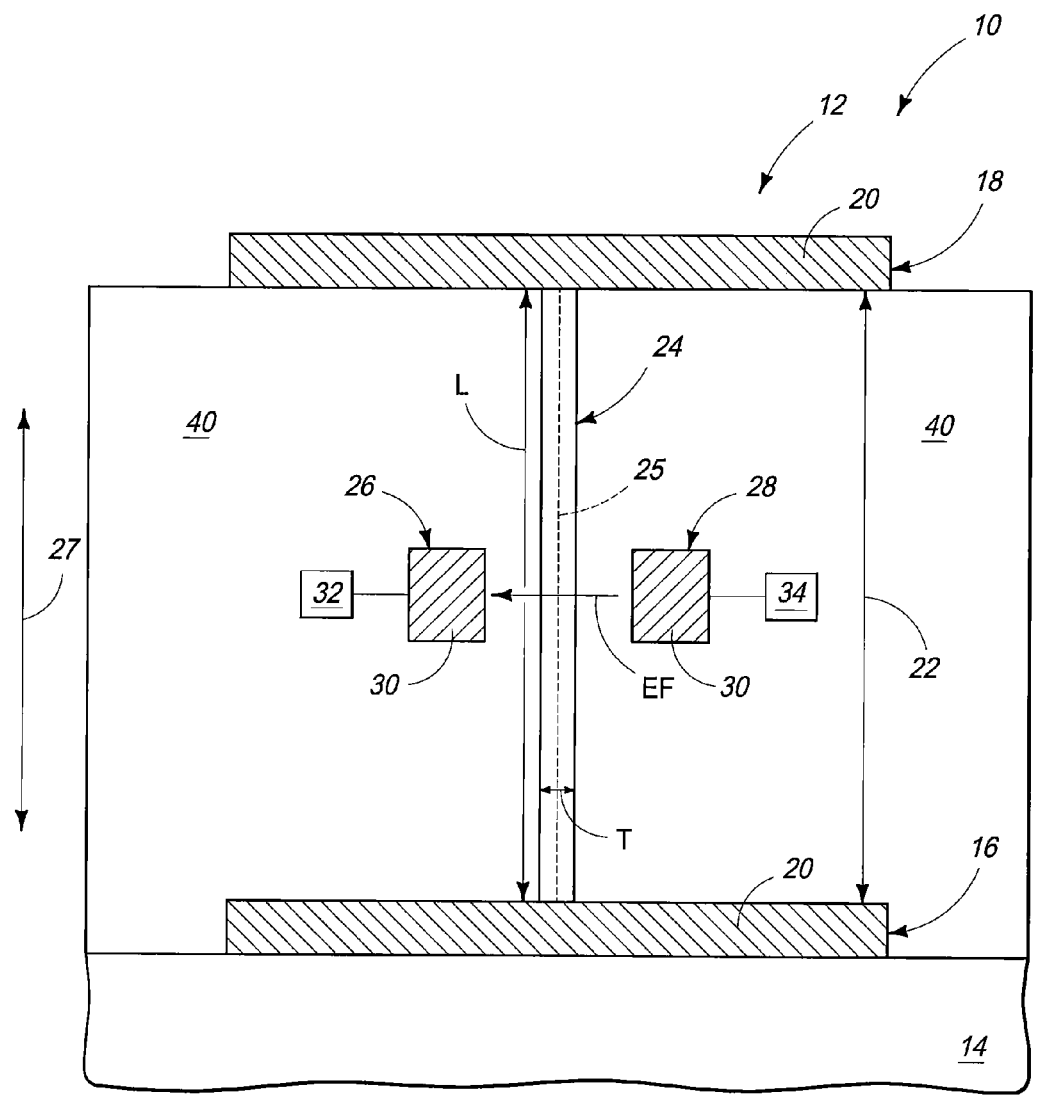
FIG. 1 is a diagrammatic, cross-sectional side view of an example embodiment switch.

A portion of an integrated circuit construction 10 is illustrated in FIG. 1, showing an example embodiment switch 12 supported by a base 14. Although the base is shown to be homogeneous, such base may comprise numerous components and materials in various embodiments. For instance, the base may comprise a semiconductor substrate supporting various materials and components associated with integrated circuit fabrication. Example materials that may be associated with the substrate include one or more of refractory metal materials, barrier materials, diffusion materials, insulator materials, etc. The semiconductor substrate may, for example, comprise, consist essentially of, or consist of monocrystalline silicon. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The switch 12 includes a first electrode 16 and a second electrode 18. Such electrodes are spaced-apart from one another, and specifically are separated from one another by a space 22 in the shown embodiment.

The electrodes 16 and 18 comprise electrically conductive electrode material 20. Such electrode material may comprise any suitable electrically conductive composition, or combination of compositions; and may, for example, comprise one or more of various metals (for instance, tungsten, titanium, copper, etc.), metal-containing materials (for instance, metal silicide, metal carbide, metal nitride, etc.), and conductively-doped semiconductor materials (for instance, conductively-doped silicon, conductively-doped germanium, etc.). Although both of the electrodes 16 and 18 are shown comprising the same electrically conductive material, in other embodiments the electrodes 16 and 18 may comprise different conductive materials relative to one another.

A graphene structure 24 extends between the electrodes. The graphene structure may be referred to as extending longitudinally between the electrodes; with the term "longitudinally" being used to designate an orientation of the graphene structure to which other components may be compared. For instance, the electrodes 16 and 18 may be considered to be spaced from one another along the longitudinal dimension of the graphene structure; and the graphene structure may be considered to have a thickness, "T", along a lateral dimension which extends orthogonally to the longitudinal dimension. The "longitudinal" dimension of the graphene structure may be any part of the graphene structure designated as such; and may or may not be the longest dimension of the graphene structure.

In the shown embodiment, the graphene structure extends across the space 22, and directly contacts both of the electrodes 16 and 18. In some embodiments, the graphene structure will comprise more than one layer of graphene. For instance, the graphene structure may be a bilayer structure. A dashed-line 25 is shown within the structure 24 to diagrammatically illustrate that such structure may comprise two layers of graphene in some embodiments. The layers may be the same thickness as one another, or may be different thicknesses relative to one another.

In operation, current flows along the graphene structure 24 between the electrodes 16 and 18 when the switch 12 is in an "on" state. Such current flow may be considered to be along the direction of an axis 27.

The switch 12 comprises a pair of nodes 26 and 28, with such nodes being laterally outward of the graphene structure and on opposing sides of the graphene structure 24 in the shown embodiment. The nodes comprise electrically conductive material 30. Such electrically conductive material may comprise any suitable composition, including any of the compositions described above with reference to the electrodes 16 and 18. Although the nodes 26 and 28 are shown comprising a same composition as one another, in other embodiments the nodes may comprise different compositions relative to one another.

The nodes 26 and 28 are connected to circuitry 32 and 34, respectively, with such circuitry being configured to generate an electric field (EF) between the nodes. Such electric field is transverse to a direction of current flow along graphene structure 24. Although the electric field is illustrated as being oriented from electrode 28 toward electrode 26, the electric field may be oriented in an opposite direction in other embodiments. The field EF may comprise an electric field that is primarily orthogonal to the graphene structure (as shown), or may comprise an electric field that is primarily at an angle other than orthogonal to the graphene structure. If an electric field is primarily at an angle other than parallel to the direction of current flow along the graphene structure (i.e., a direction other than along axis 27), such electric field will have a vector component that corresponds to the illustrated field EF which is transverse to the direction of current flow along graphene structure 24. Thus, the generation of an electric field that is directed primarily along any direction other than parallel to the axis 27 may be considered to comprise generation of an electric field transverse to the direction of current flow along graphene structure 24. It is noted that an electric field component along axis 27 (i.e., parallel to a direction of current flow along graphene structure 24) may be useful to assist in moving electrons from electrode 16 to 18, or vice versa, in the "on" state of the switch.

The nodes 26 and 28 may be considered together as an electrical component configured to alter a bandgap within graphene of the graphene structure 24. Specifically, the electric field generated between the nodes may alter the bandgap within graphene of the graphene structure 24 by taking advantage of the relationship described by Feng Wang.

Manipulation of the magnitude of the electric field transverse to current flow within the graphene structure 24 may be used to control the state of the switch. A relatively high transverse electric field may be utilized to maintain the switch 12 in an "off" state, while a relatively low transverse electric field may be utilized to maintain the switch 12 in an "on" state. The terms "relatively high transverse electric field" and "relatively low transverse electric field" are utilized to indicate that the transverse electric fields are low and high relative to one another. In some embodiments, the total voltage differential between the nodes 26 and 28 may be changed by about 0.25 eV to transition the switch from the "on" state to the "off" state, or vice versa. In some embodiments, the transition from the "on" state to the "off" state may be achieved by providing a transverse electric field of less or equal to about 3 volts/nanometer, and in some embodiments may be achieved by providing a transverse electric field of less or equal to about 2 volts/nanometer.

The graphene structure 24 has a length "L" from electrode 16 to electrode 18, and the thickness "T" along a direction orthogonal to the length. The length and thickness of the graphene structure may be tailored to achieve desired performance characteristics; and additionally the spacing between nodes 26 and 28, and the direction of the electric field generated between such nodes, may be tailored to achieve desired performance characteristics.

In some embodiments, the graphene structure 24 will have a maximum overall thickness between the nodes 26 and 28 of less than about 5 nanometers. In some embodiments, the graphene structure will comprise two or more layers, and at least one of the layers will have a maximum thickness between the nodes of less than about 5 nanometers; and in some embodiments all of such layers will have a maximum thickness between the nodes of less about 5 nanometers. In some embodiments, the individual layers of graphene will have thicknesses within a range of from at least about 1 nanometer to at least about 5 nanometers.

In some embodiments, the graphene structure 24 will have a length "L" within a range of from at least about 10 nanometers to at least about 50 nanometers.

Figure 1A:
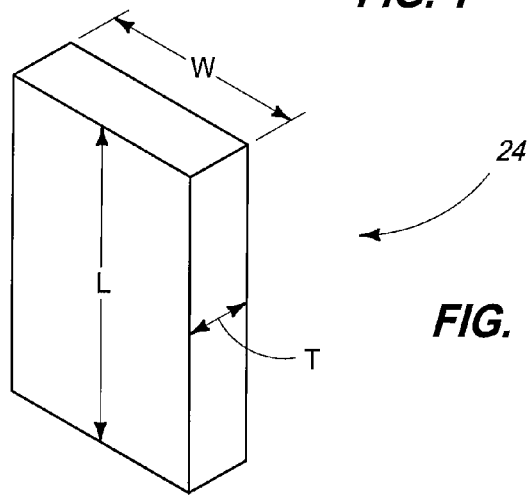
FIG. 1A is a diagrammatic, three-dimensional view of an example embodiment graphene structure that may be utilized in the switch of FIG. 1.

In some embodiments, the graphene structure 24 may be rectangular-shaped. An example rectangular-shaped graphene structure is shown in FIG. 1A. Such structure has the length "L" and the thickness "T" discussed above, and in addition has a width "W". The width may be tailored, in addition to the thickness and length, to achieve desired bandgap characteristics in the graphene, and desired performance characteristics of the switch 12 (FIG. 1). In some embodiments, the graphene structure 24 will have a width "W" of from at least about 5 nanometers to at least about 20 nanometers.

The graphene structure 24 may be configured relative to the electric field "EF" of the switch 12 of FIG. 1 so that the electric field extends primarily along the thickness "T" of the graphene structure (as shown in FIG. 1), or may be rotated relative to the configuration of FIG. 1 so that the electric field extends primarily along the width "W" of the graphene structure, or may be rotated so that the electric field extends through the graphene structure along a primary direction which is angled relative to both the thickness and the width of the graphene structure.

In some embodiments, the graphene structure 24 may comprise two or more graphene layers which are dimensionally configured to take advantage of the relationship described by H. Dai so that the graphene has an inherent bandgap in the absence of a transverse electric field. Such can provide an additional parameter to tailor the conductivity of the "on" state mode of switch 12 for particular applications. In other embodiments, the graphene structure 24 may comprise one or more layers which all individually have dimensions too large for a significant bandgap to be within the graphene of the structure 24 in the absence of an applied transverse electric field. Such can enable the graphene structure to have very high conductance in the "on" state mode of the switch.

A dielectric material 40 is shown within the space between the electrodes 16 and 18, and surrounding the nodes 26 and 28. The dielectric material may comprise any suitable composition or combination of compositions, and in some embodiments may comprise one or more of silicon dioxide, silicon nitride, and any of various doped glasses (for instance, borophosphosilicate glass, phosphosilicate glass, fluorosilicate glass, etc.). Although the dielectric material 40 is shown to be homogeneous throughout the switch 12, in other embodiments multiple different dielectric materials may be utilized.

The nodes 26 and 28 may be connected to any suitable circuitry to enable the transverse electric field to be generated across the graphene structure 24. In some embodiments, each of the nodes may be conductively coupled to one of the electrodes 16 and 18. An example of such embodiments is described with reference to a construction 10a shown in FIGS. 2 and 3. Such construction comprises a switch 12a analogous to the switch 12 described above with reference to FIG. 1, but comprising projections 42 and 44 extending from the electrodes 16 and 18, respectively.

The projections 42 and 44 may be referred to as a first projection and a second projection, respectively. The first projection extends from electrode 16 and partially across the space 40 between the electrodes, and the second projection extends from electrode 18 and partially across the space 40 between electrodes. The nodes 26 and 28 comprise portions of the projections 42 and 44 that vertically overlap one another in the illustrated configuration.

In the shown embodiment, the projections 42 and 44 comprise the same material 20 as the electrodes 16 and 18. In other embodiments, either or both of the projections 42 and 44 may comprise a different composition than the electrode that such projection extends from.

In operation, the switch 12a may be considered to have at least three different operational modes.

In a first mode, there is no voltage differential between the electrodes 16 and 18. Accordingly, there is no electric field (EF), and the bandgap within graphene of the graphene structure 24 will thus be small. Yet, there will be no current flow within the graphene structure due to the lack of the voltage differential between the electrodes 16 and 18.

In a second mode, a voltage differential is provided between the electrode 16 and 18, and such differential is small enough so that the switch remains in an "on" state. In other words, the electric field between the nodes 26 and 28 remains small enough that a bandgap within graphene of graphene structure 24 does not increase to a level which would effectively stop current flow along structure 24. While the switch 12a remains in the second mode, current flow along structure 24 may or may not increase proportionally to an increasing voltage differential between electrodes 16 and 18. The relationship of the current flow along structure 24 to the voltage differential between electrodes 16 and 18 will depend, at least in part, on the distance between projections 42 and 44, the compositions of the projections, the composition of the dielectric material between the projections, the composition of structure 24, and the dimension and orientation of the region of structure 24 between the projections. Any or all of such parameters may be tailored to achieve a desired relationship of the current flow along structure 24 to the voltage differential between the electrodes 16 and 18.

In a third mode, the voltage differential between electrodes 16 and 18 reaches a level which causes the switch to be in an "off" state. In other words, the electric field between nodes 26 and 28 becomes large enough to increase the bandgap of graphene within graphene structure 24 to a level which effectively stops current flow along structure 24.

In some embodiments, the current flow along structure 24 in the "off" state of the switch will be 0 milliamps. In other embodiments, the current flow along structure 24 in the "off" state may be a non-zero value, but such current flow will still be low relative to the current flow along the structure in the "on" state of the switch.

In some embodiments, the pulse shape of the voltage increase or decrease utilized to transition between the "on" and "off" states of a switch may be tailored for desired performance characteristics of the switch. In some embodiments, the rise time or fall time of the voltage change utilized to transition between the "on" and "off" states of a switch may be tailored for desired performance characteristics of the switch. In some embodiments, the switch may be tailored so that current flow along graphene structure 24 increases with an increasing voltage differential between electrodes 16 and 18 while the switch remains in the "on" state, and then the current flow may abruptly cease when the voltage differential reaches a level which transitions the switch to the "off" state. In some embodiments, the switch may be tailored to gradually taper current flow along structure 24 during the transition of the switch from the "on" state to the "off" state.

Figure 2:
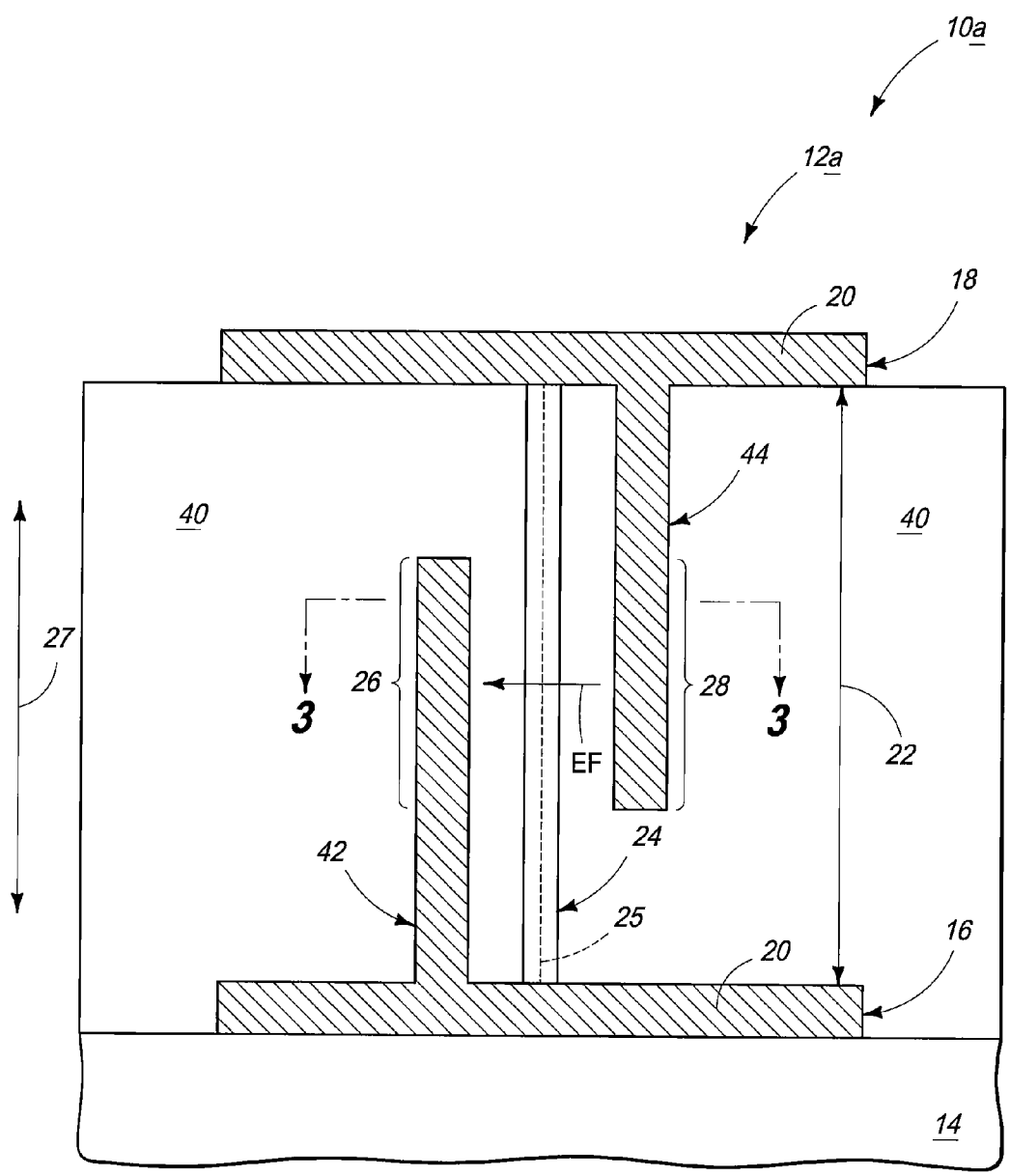
FIG. 2 is a diagrammatic, cross-sectional side view of another example embodiment switch.
Figure 3:
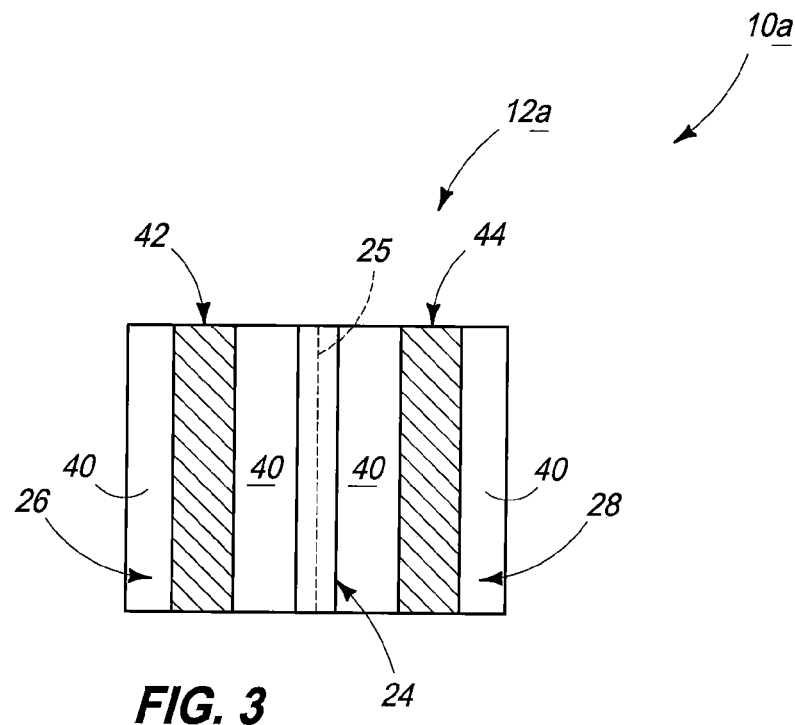
FIG. 3 is a cross-sectional view along the line 3-3 of FIG. 2.
Figure 4:
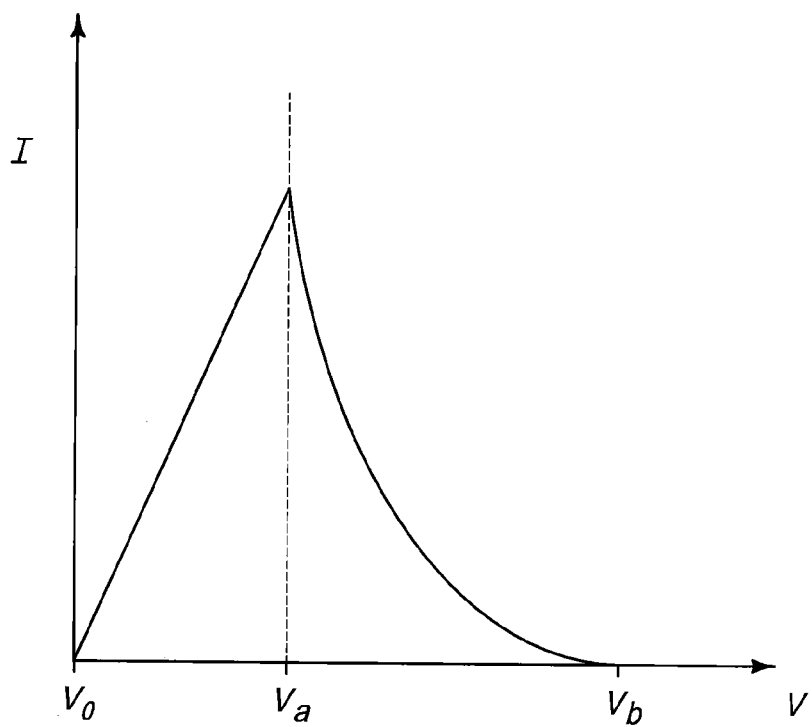
FIG. 4 is a graphical illustration of operational characteristics of an example embodiment switch.

FIG. 4 graphically illustrates operation of an example embodiment switch of the type shown in FIGS. 2 and 3. Specifically, the graph of FIG. 4 shows the current through the switch increasing with an initial increase in the voltage differential between electrodes 16 and 18 above a level of zero ($V_0$); then decreasing after the voltage differential reaches a transition level ($V_a$), and finally ceasing altogether when the voltage differential reaches a level $V_b$. The graph of FIG. 4 is provided to assist the reader in understanding operation of an example embodiment switch, and is not to limit the invention or any embodiments thereof, except to the extent, if any, that actual characteristics of the graph of FIG. 4 are expressly recited in the claims which follow.

In some embodiments, the switch of FIGS. 2 and 3 may be considered to be a self-limiting device, in that it turns itself off when a voltage differential between electrodes 16 and 18 reaches a predetermined threshold ($V_b$ of FIG. 4).

Figure 5:
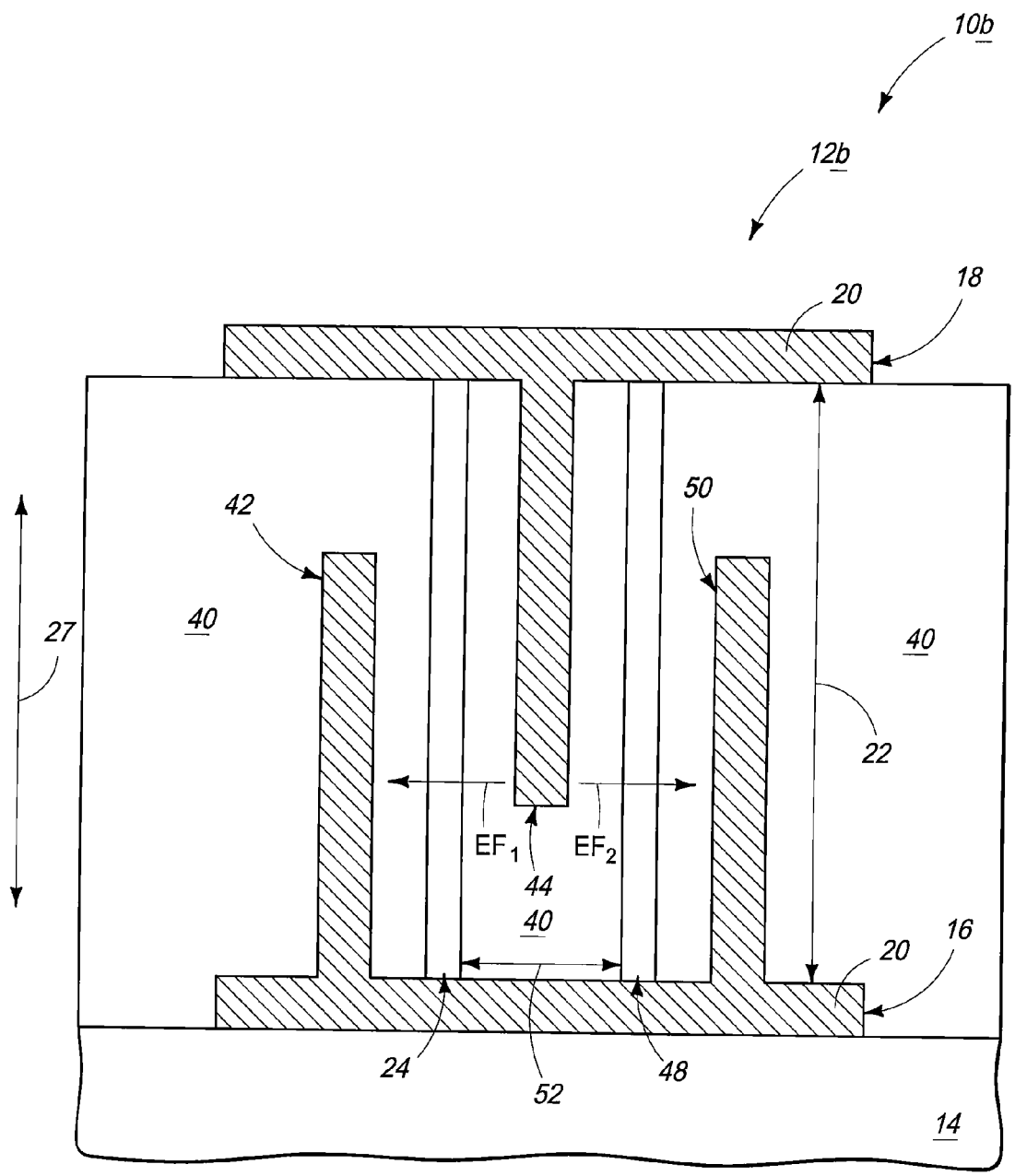
FIG. 5 is a diagrammatic, cross-sectional view of another example embodiment switch.

The switch of FIGS. 2 and 3 comprises a single graphene structure 24. In other embodiments, switches may be configured to comprise two or more graphene structures. FIG. 5 shows a construction 10b comprising an example embodiment switch 12b which comprises two graphene structures.

The switch 12b comprises the electrodes 16 and 18, the graphene structure 24, and the projections 42 and 44 discussed above relative to FIGS. 2 and 3. Additionally, the switch 12b comprises another graphene structure 48 on an opposite side of projection 44 from the graphene structure 24, and comprises another projection 50 extending upwardly from the electrode 16.

In some embodiments, the graphene structures 24 and 48 may be referred to as a first graphene structure and a second graphene structure, respectively. Such graphene structures are spaced apart from one another by a gap 52. A first projection (specifically, the projection 44) extends downwardly from electrode 18 and into such gap, with such first projection being between the two graphene projections. Second and third projections 42 and 50 extend upwardly from electrode 16, and are on opposing sides of the first and second graphene structures (24 and 48) from the first projection 44.

A region of projection 44 vertically overlaps with regions of projections 42 and 50, and in operation first and second electric fields $EF_1$ and $EF_2$ may be generated between such vertically-overlapping regions (as shown). The electric fields are transverse to the direction that current is conducted through graphene structures 24 and 48, and may be utilized to control whether the switch is in an "on" state or an "off" state—analogously to the utilization of the electric field EF of FIG. 2. Although the fields $EF_1$ and $EF_2$ are illustrated as being comprised by electric fields that are primarily orthogonal to the graphene structures, in other embodiments, one or both of the fields $EF_1$ and $EF_2$ may be a vector component of an electric field that extends primarily along a direction other than orthogonal the graphene structures. Also, although the graphene structures are shown to be substantially parallel to one another, in other embodiments they may not be.

The switch 12b of FIG. 5 is an example of a configuration in which there are three projections for every two graphene structures.

The utilization of the additional graphene structure in the switch of FIG. 5, relative to the switch of FIG. 2, may provide additional parameters which may be modified to tailor the switch of FIG. 5 for a particular application. For instance, the graphene structures 24 and 48 of the FIG. 5 switch may be the same as one another or different. In some embodiments, both of such graphene structures may be bilayer structures; and in such embodiments the individual layers utilized in structure 24 may be the same or different in thickness, or any other relevant property, than the individual layers utilized in structure 48.

Figure 6:
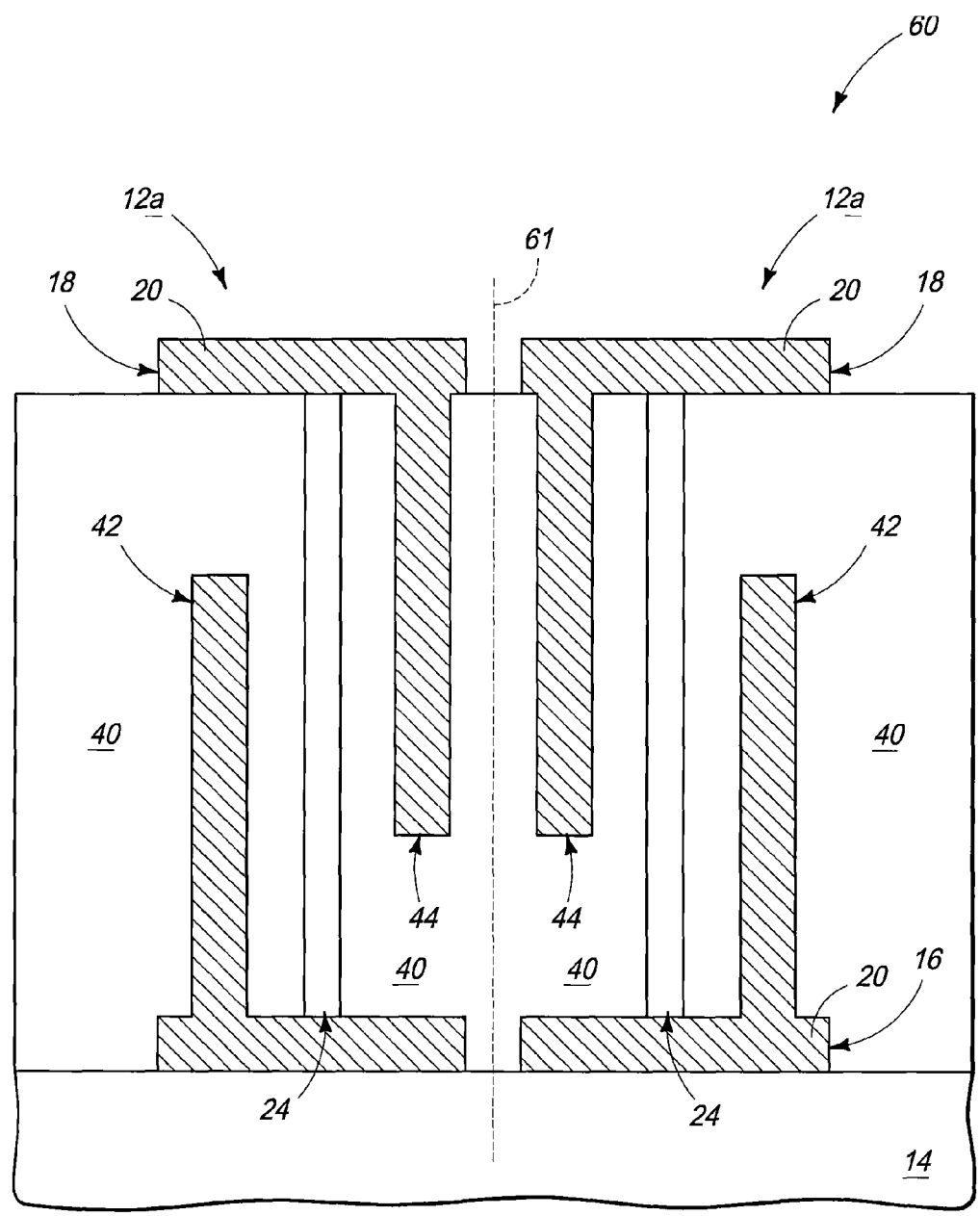
FIG. 6 is a diagrammatic, cross-sectional view of a construction comprising a pair of example embodiment switches.

The various switches described herein may be utilized in memory devices, or other devices. In such embodiments, it may be advantageous to tightly pack a plurality of switches over a semiconductor substrate. FIG. 6 shows a construction 60 having a pair of switches 12a (of the type described above with reference to FIG. 2) packed next to one another. In the shown embodiment, the switches are mirror images of one another along a vertical plane 61. In some embodiments, such configuration may enable two adjacent switches to be formed in a common trench.

Figure 7:
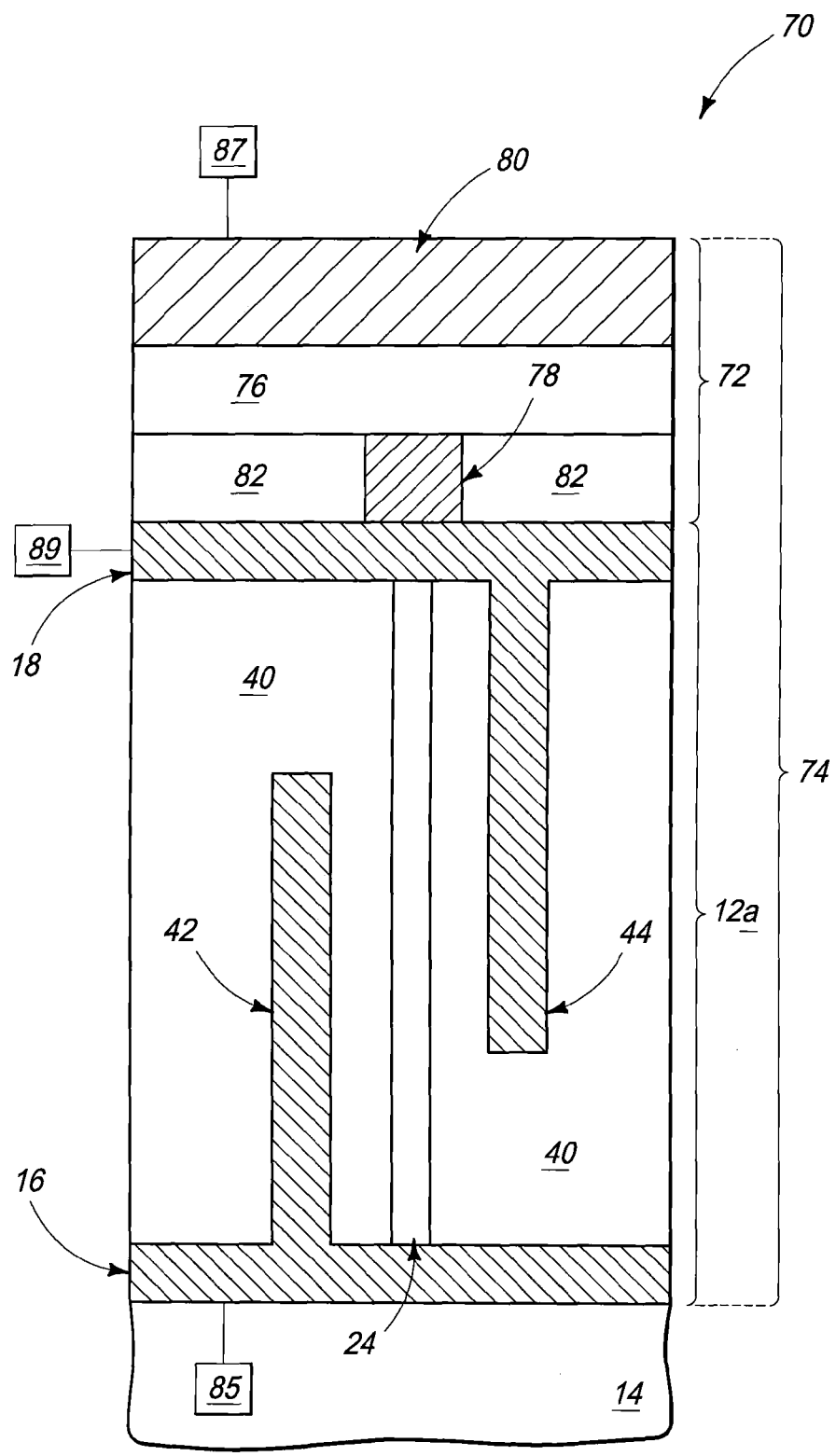
FIG. 7 is a diagrammatic, cross-sectional view of a construction comprising an example embodiment memory cell in combination with an example embodiment select device.

In some embodiments, switches of the types described above may be utilized as select devices associated with a memory device. FIG. 7 illustrates a portion of a semiconductor construction 70 comprising a switch 12a (of the type described above with reference to FIG. 2) paired with a memory cell 72. The switch is configured as a select device for the memory cell, and in some embodiments the structures 12a and 72 may be considered together as a memory cell/ select device unit 74.

The illustrated memory cell 72 is a cross-point memory cell comprising programmable material 76 between a pair of electrodes 78 and 80. In the shown embodiment, the electrode 78 is relatively narrow along the cross-section of FIG. 7, and the electrode 80 and programmable material 76 are relatively wide along such cross-section. In other embodiments, the cross-point memory cell may have a different configuration.

The bottom and top electrodes 78 and 80 may comprise any suitable compositions, or combinations of compositions; and in some embodiments may comprise one or more of various metals, metal-containing materials, and conductively-doped semiconductor materials. The electrodes 78 and 80 may be the same composition as one another, or may be different compositions relative to one another.

The programmable material 76 may comprise any suitable composition; and in some embodiments may be a chalcogenide and/or a material having mobile ions therein.

Although the electrode 78 of the memory cell 72 is shown separate from the electrode 18 of the select device 12a, in other embodiments the electrodes 18 and 78 may be a single common electrode.

Dielectric material 82 is above the electrode 18 of the select device 12a, and adjacent the electrode 78 of the memory cell. The dielectric material 82 may comprise any suitable composition; and in some embodiments may comprise one or both of silicon dioxide and silicon nitride.

The bottom electrode 16 of the select device 12a is shown to be electrically connected to circuitry 85, the top electrode 80 of the memory cell 72 is shown to be electrically connected to circuitry 87, and the top electrode 18 of select device 12a is shown to be electrically connected to circuitry 89. In some embodiments, the circuitries 85 and 87 correspond to access/ sense lines (i.e., wordlines and bitlines), and the circuitry 89 corresponds to circuitry utilized to control flow of current through the select device 12a (alternatively, the circuitry 85 could correspond to the circuitry utilized to control flow of current through the select device while the circuitry 89 corresponds to an access/sense line).

In operation, the memory cell 72 is accessed when a voltage differential between the electrodes 16 and 18 of the select device 12a is low enough to enable current flow along graphene structure 24. When the memory cell 72 is not being accessed, a voltage differential between electrodes 16 and 18 is maintained high enough to prevent current flow (and specifically leakage) along graphene structure 24.

Figure 8:
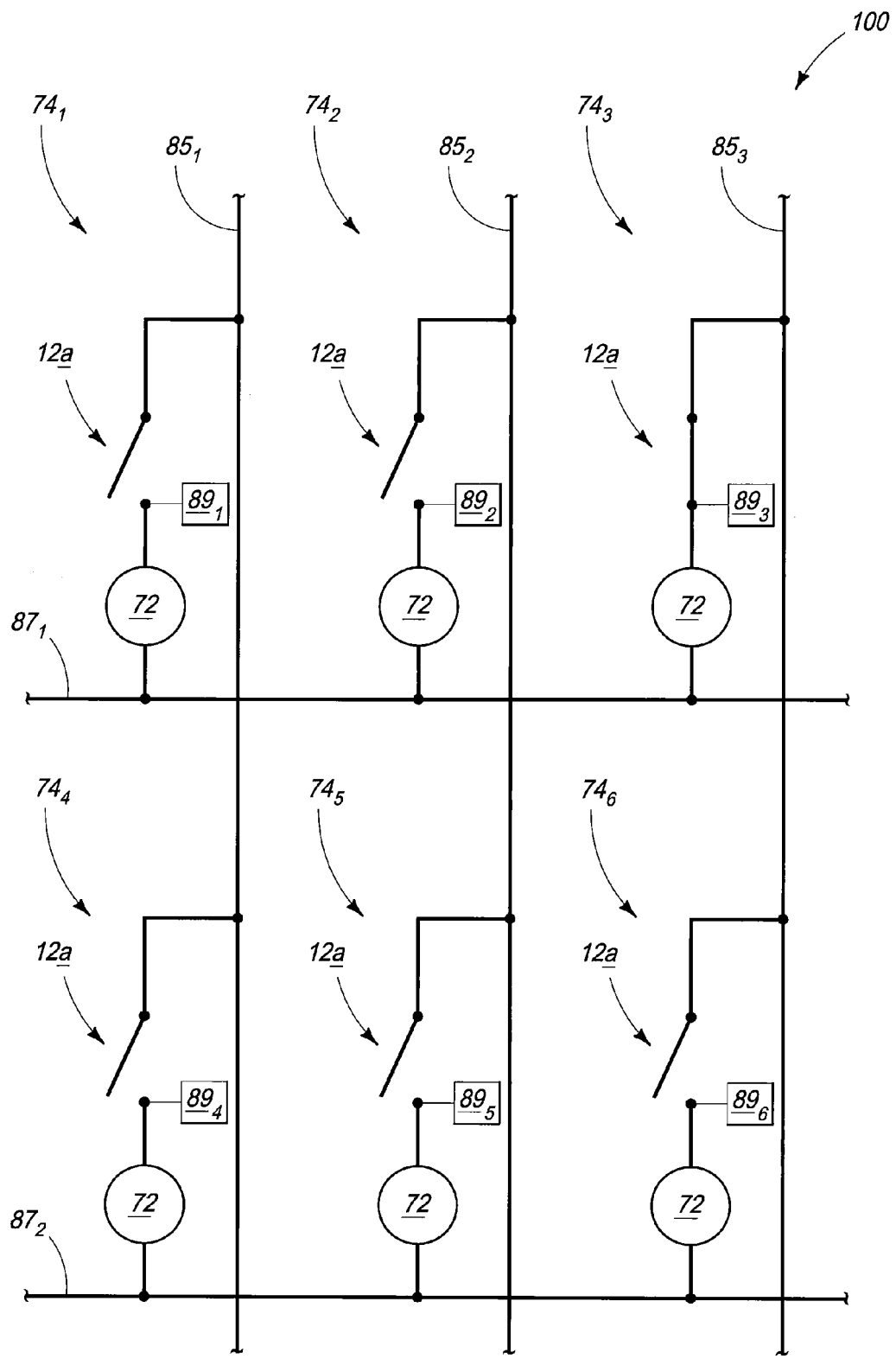
FIG. 8 is a schematic view of a portion of an example embodiment memory device.

FIG. 8 schematically illustrates a memory device (e.g., a memory array) 100 comprising a plurality of units $74_{1-6}$ corresponding to memory cells 72 paired with select devices 12a. The memory device 100 comprises a first series of access/sense lines $85_{1-3}$, and a second series of access/sense lines $87_1$ and $87_2$. The memory device 100 also comprises circuitry $89_{1-6}$ coupled with the units $74_{1-6}$.

In operation, a first subset of memory cells is identified which is to be selected during a read or write operation. The selected subset may be only a single memory cell; such, for example, as when the memory state of a single memory cell is to be ascertained during a read operation. Alternatively, the selected subset may contain a plurality of memory cells; such as, for example, when multiple memory cells are to be simultaneously programmed during a write operation, or when multiple memory cells are to be simultaneously erased. The identification of the first subset of memory cells correspondingly also identifies a second subset of memory cells which is not to be selected during the read or write operation.

The device 100 of FIG. 8 is shown at an operational stage in which the memory cell/select device unit $74_3$ comprises a memory cell within the first subset (i.e., the subset in which the memory cell is to be selected), and the other memory cell/select device units comprise memory cells within the second subset (i.e., the subset in which the memory cells are not to be selected). Accordingly, the select device 12a of unit $74_3$ is shown in a closed position (i.e., in an "on" position of the switch 12a), while the select devices of the other units are shown in open positions (i.e., in "off" positions of the switches 12a).

In some embodiments, a high voltage differential may be maintained between the access/sense lines 85 and the circuitry 89 across all of the units of memory device, and then such voltage differential may be reduced for those units that are to be selected during a read or write operation. Accordingly, the operational stage of FIG. 8 may have a reduced voltage differential between access/sense line $85_3$ and circuitry $89_3$ relative to the voltage differential between the lines 85 and the circuitry 89 of the other memory cell/select device units. Such reduced voltage differential closes the switch corresponding to the select device of unit $74_3$, while keeping the switches within the other units open.

Figure 9:
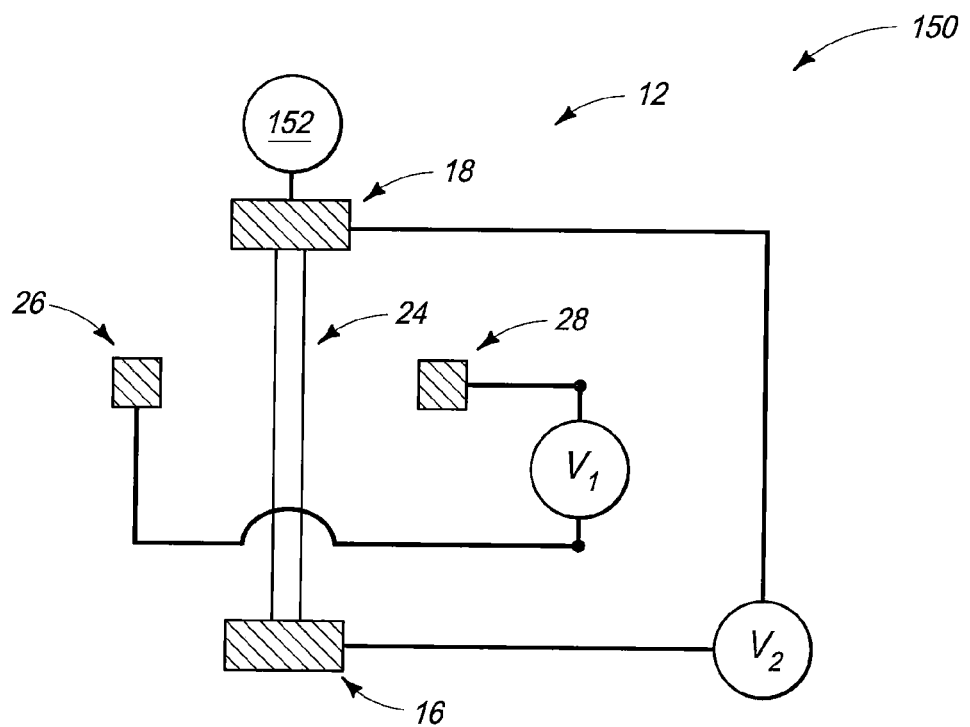
FIG. 9 is a diagrammatic view of a construction comprising a memory cell in combination with an example embodiment switch as a select device.
Figure 10:
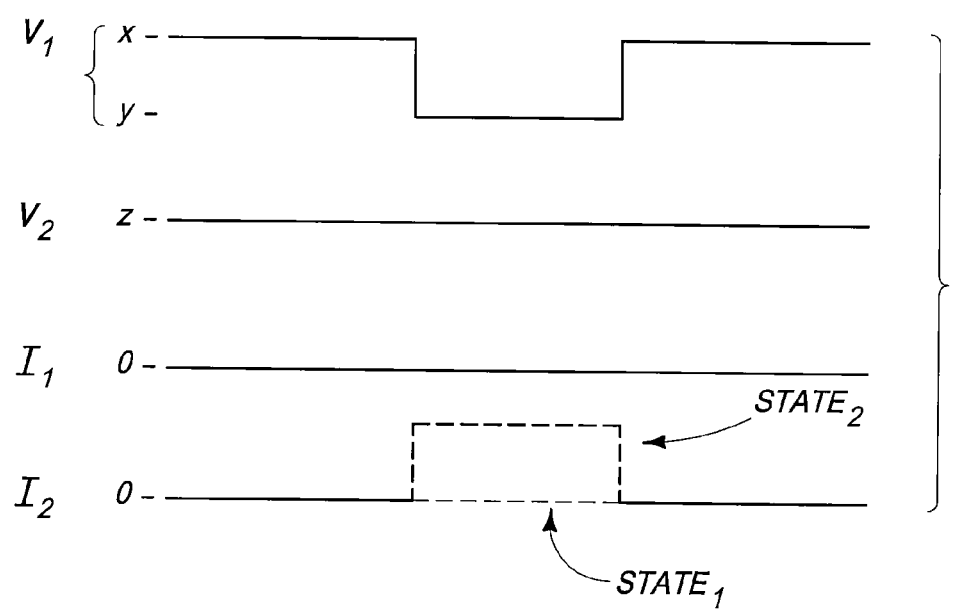
FIG. 10 is a graphical illustration of the operation of the example embodiment switch of FIG. 9.

FIGS. 9 and 10 further illustrate utilization of an example embodiment switch as a select device for accessing a memory cell.

FIG. 9 shows a construction 150 comprising a switch 12 (specifically, a switch of the type described above with reference to FIG. 1) conductively coupled to a memory cell 152. The memory cell 152 may be any suitable memory cell, and in some embodiments may be analogous to the memory cells 72 discussed above with reference to FIGS. 7 and 8. The switch 12 comprises the electrodes 16 and 18, and the graphene structure 24 between such electrodes. The switch 12 also comprises the electrical nodes 26 and 28 provided on opposing sides of the graphene structure relative to one another. The configuration of FIG. 9 comprises a first voltage differential ($V_1$) between the nodes 26 and 28, and a second voltage differential ($V_2$) between the electrodes 16 and 18.

FIG. 10 illustrates operational characteristics of the construction 150 of FIG. 9. Specifically, FIG. 10 shows the voltage differential $V_2$ maintained at a level z, and shows the voltage differential $V_1$ alternated between two levels x and y. FIG. 10 also shows current flow between the nodes 26 and 28 of FIG. 9 as $I_1$, and shows current flow between the electrodes 16 and 18 of FIG. 9 as $I_2$.

When $V_1$ is at the higher level (x), there is no current flow between electrodes 16 and 18 (i.e., the current $I_2$ is about zero). In contrast, when $V_1$ is dropped to the lower level (y) there may or may not be current flow between the electrodes (i.e., the current $I_2$ may or may not have a nonzero value) depending on whether the memory cell 152 (FIG. 9) is in a higher resistance memory state (State$_1$) or a lower resistance memory state (State$_2$).

The current $I_1$ of FIG. 10 (i.e., the current between nodes 26 and 28 of FIG. 9), remains about zero regardless of the operational state of the construction 150 of FIG. 9. Thus, the utilization of nodes 26 and 28 and to form the electric field across graphene structure 24 draws little power, regardless of the operational state of the construction 150.

The switches and memory devices discussed above may be incorporated into integrated circuits suitable for utilization in any of numerous electronic systems. For instance, such integrated circuits may be suitable for utilization in one or more of clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a switch that contains a graphene structure which extends longitudinally between a pair of electrodes and which is conductively connected to both of the electrodes of said pair. The switch also contains first and second electrically conductive structures laterally outward of the graphene structure and on opposing sides of the graphene structure from one another; and the electrically conductive structures are configured to provide an electric field across the graphene structure. The first electrically conductive structure is conductively coupled to one of the electrodes, and the second electrically conductive structure is conductively coupled to the other of the electrodes.

Some embodiments include switches having a first electrode and a second electrode, with the first and second electrodes being separated from one another by a space; having a graphene structure conductively connected to both of the first and second electrodes, and extending across the space; having a first electrically conductive projection extending into the space from the first electrode, and extending only partially across the space; having a second electrically conductive projection extending into the space from the second electrode, and extending only partially across the space; and having a region of the first projection overlapping a region of the second projection; with the graphene structure being between the overlapping regions of the first and second projections.

Some embodiments include switch having a first electrode and a second electrode, with the first and second electrodes being separated from one another by a space; having first and second graphene structures conductively connected to both of the first and second electrodes, and extending across the space, with the first and second graphene structures being spaced-apart from one another by a gap; having a first electrically conductive projection extending into the space from the first electrode, and extending only partially across the space, with the first electrically conductive projection being on one side of the first graphene structure; having a second electrically conductive projection extending into the space from the second electrode, and extending only partially across the space with the second electrode being between the first and second graphene structures, and being on an opposing side of the first graphene structure from the first electrically conductive projection; having a third electrically conductive projection extending into the space from the first electrode, and extending only partially across the space, with the third electrically conductive projection being on an opposing side of the second graphene structure from the second electrically conductive projection; having a region of the first projection overlapping a region of the second projection, with the first graphene structure being between the overlapping regions of the first and second projections; and having a region of the second projection overlapping a region of the third projection, with the second graphene structure being between the overlapping regions of the second and third projections.

Some embodiments include integrated circuitry having a memory cell and a switch electrically coupled to the memory cell. The switch comprises a graphene structure conductively connected to both electrodes of a pair of electrodes, and further comprises a component adjacent the graphene structure and configured to alter a bandgap within graphene of the graphene structure.

Some embodiments include integrated circuitry having a memory cell and a select device electrically coupled to the memory cell. The select device comprises a graphene structure extending between a pair of electrodes and conductively connected to both of the electrodes. The select device further comprises a pair of electrical nodes, with the nodes being configured to create an electric field between them and across the graphene structure. The graphene structure is a better conductor of current between the electrodes in an "on" state of the select device than in an "off" state of the select device. The select device is in the "on" state while there is a relatively small electric field between the nodes, and is in the "off" state while there is a relatively high electric field between the nodes.

Some embodiments include methods of selecting individual memory cells. The memory cells are paired with select devices. The individual select devices are switches containing a graphene structure between a pair of electrodes, and containing electrical nodes on opposing sides of the graphene structure from one another. The methods include, during a read or write operation, identifying a first subset of memory cells that are to be selected, and identifying a corresponding second subset of memory cells that are not to be selected; and reducing the electric fields between the electrical nodes within the select devices paired with the first subset of the memory cells relative to the electric fields between the electrical nodes within the select devices paired with the second subset of the memory cells.

Some embodiments include methods of selecting individual memory cells. The memory cells are paired with select devices. The individual select devices comprise a graphene structure extending longitudinally between a pair of electrodes and directly connected to both of the electrodes. The individual select devices have a pair of electrical nodes that are laterally outward of the graphene structure and on opposing sides of the graphene structure relative to one another, with the nodes being configured to create an electric field across the graphene structure between them, The graphene structure is a better conductor of current between the electrodes in an "on" state of the select device than in an "off" state of the select device. The individual select devices are in the "on" state while there is a relatively small electric field between the nodes, and are in the "off" state while there is a relatively high electric field between the nodes. The method includes, during a read or write operation, identifying a first subset of memory cells that are to be selected, and identifying a corresponding second subset of memory cells that are not to be selected; and reducing the electric fields between the electrical nodes within the select devices paired with the first subset of the memory cells while maintaining the relatively high electric field between the electrical nodes within the select devices paired with the second subset of the memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A switch comprising:
a first electrode spaced from a second electrode;
first and second graphene structures conductively connected to both of the first and second electrodes;
a first electrically conductive projection extending from the first electrode and being on one side of the first graphene structure;
a second electrically conductive projection extending from the second electrode, being between the first and second graphene structures, and being on an opposing side of the first graphene structure from the first electrically conductive projection;
a third electrically conductive projection extending from the first electrode and being on an opposing side of the second graphene structure from the second electrically conductive projection;
a region of the first projection overlapping a region of the second projection; the first graphene structure being between the overlapping regions of the first and second projections; and
a region of the second projection overlapping a region of the third projection; the second graphene structure being between the overlapping regions of the second and third projections.

2. Integrated circuitry comprising:
a memory cell;
a switch electrically coupled to the memory cell, the switch comprising a graphene structure conductively connecting a first electrode to a second electrode in a first direction, wherein the switch further comprises a pair of electrically conductive structures configured to provide an electric field across the graphene structure in a second direction different from the first direction, with one of the electrically conductive structures being conductively coupled to one of the electrodes of said pair of electrodes, and with the other of the electrically conductive structures being conductively coupled to the other of the electrodes of said pair of electrodes; and a silicon-containing base supporting the memory cell and switch.

3. The integrated circuitry of claim 2, wherein the memory cell is a cross-point memory cell.

4. The integrated circuitry of claim 2, wherein the memory cell is a PCRAM cell or an RRAM cell.

5. The integrated circuitry of claim 2, wherein the graphene structure comprises two layers of graphene.

6. The integrated circuitry of claim 2, wherein the second direction is substantially orthogonal to the first direction.

* * * * *

UNITED STATES PATENT AND TRADEMARK OFFICE
CERTIFICATE OF CORRECTION

PATENT NO.        : 8,630,145 B2
APPLICATION NO.   : 13/886181
DATED             : January 14, 2014
INVENTOR(S)       : Gurtej S. Sandhu It is certified that error appears in the above-identified patent and that said Letters Patent is hereby corrected as shown below:

On the title page, item (63), under "Related U.S. Application Data", in column 1, line 1, delete "Continuation-in-part" and insert -- Continuation --, therefor.

Signed and Sealed this
Twenty-fifth Day of March, 2014

Michelle K. Lee
*Deputy Director of the United States Patent and Trademark Office*